US011255181B2

(12) United States Patent
Guner et al.

(10) Patent No.: US 11,255,181 B2
(45) Date of Patent: Feb. 22, 2022

(54) CALCULATION OF MUD ANGLE FOR IMAGING WELLS WITH OIL BASED MUDS

(71) Applicant: Halliburton Energy Services, Inc., Houston, TX (US)

(72) Inventors: Baris Guner, Houston, TX (US); Burkay Donderici, Pittsford, NY (US)

(73) Assignee: Halliburton Energy Services, Inc., Houston, TX (US)

( * ) Notice: Subject to any disclaimer, the term of this patent is extended or adjusted under 35 U.S.C. 154(b) by 181 days.

(21) Appl. No.: 16/491,205

(22) PCT Filed: Oct. 31, 2017

(86) PCT No.: PCT/US2017/059252
§ 371 (c)(1),
(2) Date: Sep. 5, 2019

(87) PCT Pub. No.: WO2019/088998
PCT Pub. Date: May 9, 2019

(65) Prior Publication Data
US 2020/0256183 A1    Aug. 13, 2020

(51) Int. Cl.
*G01V 3/00* (2006.01)
*E21B 47/022* (2012.01)
(Continued)

(52) U.S. Cl.
CPC ............ *E21B 47/022* (2013.01); *E21B 47/12* (2013.01); *E21B 49/005* (2013.01); *G01V 1/201* (2013.01);
(Continued)

(58) Field of Classification Search
CPC ............ G01V 3/083; G01V 3/12; G01V 3/24; G01V 3/20; G01V 3/18; G01V 1/201;
(Continued)

(56) References Cited

U.S. PATENT DOCUMENTS 3,060,373 A    10/1962  Doll
3,132,298 A     5/1964  Doll et al.
(Continued)

FOREIGN PATENT DOCUMENTS

CA          685727       5/1964
WO       2019177588      9/2019

OTHER PUBLICATIONS

ISRWO International Search Report and Written Opinion for PCT/US2017/059252 dated Jul. 26, 2018.
(Continued)

Primary Examiner — Raul J Rios Russo
(74) Attorney, Agent, or Firm — John Wustenberg; C. Tumey Law Group PLLC

(57) ABSTRACT

This disclosure may relate to a system and method for calculating the mud angle from a downhole device. A method for estimating a mud angle may comprise: disposing a downhole tool into a borehole; extending an arm of the downhole tool to a first location, wherein a pad is disposed on the arm; taking a first impedance measurement with at least one button electrode, wherein the button electrode is disposed in a button array, wherein the button array is disposed on the pad; extending the arm to a second location; taking a second impedance measurement with the at least one button electrode; transmitting the first measurement and the second measurement to an information handling system; and estimating the mud angle from the first impedance measurement and the second impedance measurement with an information handling system.

20 Claims, 8 Drawing Sheets

(51) Int. Cl.
  *E21B 47/12* (2012.01)
  *E21B 49/00* (2006.01)
  *G01V 3/08* (2006.01)
  *G01V 3/12* (2006.01)
  *G01V 3/24* (2006.01)
  *G01V 3/20* (2006.01)
  *G01V 3/18* (2006.01)
  *G01V 1/20* (2006.01)
  *G01R 27/02* (2006.01)

(52) U.S. Cl.
  CPC .............. *G01V 3/083* (2013.01); *G01V 3/12* (2013.01); *G01V 3/18* (2013.01); *G01V 3/20* (2013.01); *G01V 3/24* (2013.01); *G01R 27/02* (2013.01); *Y02A 90/30* (2018.01)

(58) Field of Classification Search
  CPC ............ G01V 3/38; G01V 3/26; Y02A 90/30; Y02A 90/344; E21B 47/022; E21B 47/12; E21B 49/005; G01R 27/02
  USPC ................................ 324/323, 347, 376, 437
  See application file for complete search history.

(56) References Cited

U.S. PATENT DOCUMENTS

| | | | |
|---|---|---|---|
| 3,379,963 | A | 4/1968 | Saurenman |
| 3,379,964 | A | 4/1968 | Segesman |
| 3,579,098 | A | 5/1971 | Mougne |
| 4,251,773 | A | 2/1981 | Cailliau et al. |
| 4,468,623 | A | 8/1984 | Gianzero et al. |
| 4,545,242 | A | 10/1985 | Chan |
| 4,567,759 | A | 2/1986 | Ekstrom et al. |
| 4,692,908 | A | 9/1987 | Ekstrom et al. |
| 4,851,781 | A | 7/1989 | Marzetta et al. |
| 4,862,090 | A | 8/1989 | Vannier et al. |
| 5,008,625 | A | 4/1991 | Chen |
| 5,012,193 | A | 4/1991 | Chen |
| 5,038,378 | A | 8/1991 | Chen |
| 6,191,588 | B1 | 2/2001 | Chen |
| RE42,493 | E | 6/2011 | Tabarovsky et al. |
| 8,579,037 | B2 | 11/2013 | Jacob |
| 8,718,942 | B2 | 5/2014 | Cheung |
| 2005/0067190 | A1 | 3/2005 | Tabanou et al. |
| 2008/0288171 | A1 | 11/2008 | Itskovich et al. |
| 2010/0155319 | A1* | 6/2010 | Felix .................. B01L 3/50215 210/188 |
| 2011/0199090 | A1* | 8/2011 | Hayman .................. G01V 3/20 324/356 |
| 2011/0241690 | A1* | 10/2011 | Hayman .................. G01V 3/24 324/355 |
| 2013/0013210 | A1* | 1/2013 | Itskovich .................. G01V 3/20 702/7 |
| 2014/0239960 | A1 | 8/2014 | Habashy et al. |
| 2014/0347056 | A1 | 11/2014 | Hayman et al. |
| 2015/0185354 | A1 | 7/2015 | Schlumberger |
| 2015/0355372 | A1 | 12/2015 | Bloemenkamp et al. |
| 2016/0136640 | A1* | 5/2016 | Losada ............... B01L 3/50215 422/533 |
| 2019/0274609 | A1* | 9/2019 | Wilkinson ....... A61B 5/150351 |

OTHER PUBLICATIONS

European Search Report for U.S. Appl. No. 17/930,164 dated Mar. 11, 2021.
SPWLA 61st Annual Logging Symposium, Guner, et al., Quantitative Demonstration of a High-Fidelity Oil-Based Mud Resistivity Imager using a Controlled Experiment, Jun. 24 to Jul. 29, 2020.
Chen, et al. A Novel Array Laterolog Method, Oct. 1998.
SPWLA 38th Annual Logging Symposium, Vigne, et al., Strange Invasion Profiles: What Multiarray Induction Logs can tell us about how Oil-Based Mud affects the invasion process and wellbore stability, Jun. 1997.
SPE22726, Safinya, et al., Improved Formation Imaging with Extended Microelectrical Arrays, 1991.
SPE30584, Smits, et al., High Resolution from a New Laterolog with Azimuthal Imaging, 1995.
SPE Formation Evaluation, Davies, et al., Azimuthal Resistivity Imaging: A New-Generation Laterolog, Sep. 1994.
SPE401, Suau, et al., The Dual Laterolog-R Tool, Jul. 1973.

* cited by examiner

CALCULATION OF MUD ANGLE FOR IMAGING WELLS WITH OIL BASED MUDS

BACKGROUND

Boreholes drilled into subterranean formations may enable recovery of desirable fluids (e.g., hydrocarbons) using a number of different techniques. A downhole tool may be employed in subterranean operations to determine borehole and/or formation properties.

Traditionally, borehole imager tools may be used in obtaining a detailed characterization of reservoirs. These borehole imager tools may provide a resistivity image of the formation immediately surrounding the borehole. In essence, their function is the electrical equivalent of the formation coring, with much higher borehole coverage. Borehole imager tools may be used to determine formation stratigraphy, dips of the formation layers as well as, borehole and formation stress. Borehole imager tools may be particularly important in learning about thin beds and fracture locations. Oil based muds may provide higher performance than the water based muds and may be preferable in deep water environments where high temperature and pressure cause loss of water and in shale zones where water may cause swelling. However, oil based mud may be highly resistive. At low frequencies, this resistance may reduce the sensitivity of the borehole imager tools to the outside formation. To overcome this effect, the tools may operate at high frequencies. At these high frequencies, pads on the borehole imager tools may become capacitively coupled to the formation, reducing the effect of the oil based mud. However, there is an upper limit to the frequencies that may be used, since at very high frequencies the dielectric effect in formations becomes dominant. As a result, the borehole imager tools may operate at multiple frequencies. A final response may be obtained by combining the results where each frequency is most accurate. Although capacitive coupling may reduce the effect of the highly resistive mud, the effect may still be a significant component of the measured impedance. The effect may be larger in low formation resistivities and higher standoffs between the borehole wall and the button arrays of the borehole imager tool (as well as lower frequencies as stated above.) A projection of the measured impedance in a direction orthogonal to the mud impedance may be used to alleviate this issue. This projection may be determined from the phase angle difference between the mud and measured formation impedances.

BRIEF DESCRIPTION OF THE DRAWINGS

For a detailed description of the preferred examples of the invention, reference will now be made to the accompanying drawings in which.

DETAILED DESCRIPTION

The present disclosure relates generally to a system and method for calculating the mud angle for imaging wells with oil based muds from a downhole device. More particularly, a system and method for taking measurements at different distances from the borehole wall and using the results to obtain the mud angle. The method may allow calculation of the mud angle in any given formation and may allow repeatability of the calculation at different depths to account for the changes in mud properties.

Figure 1:
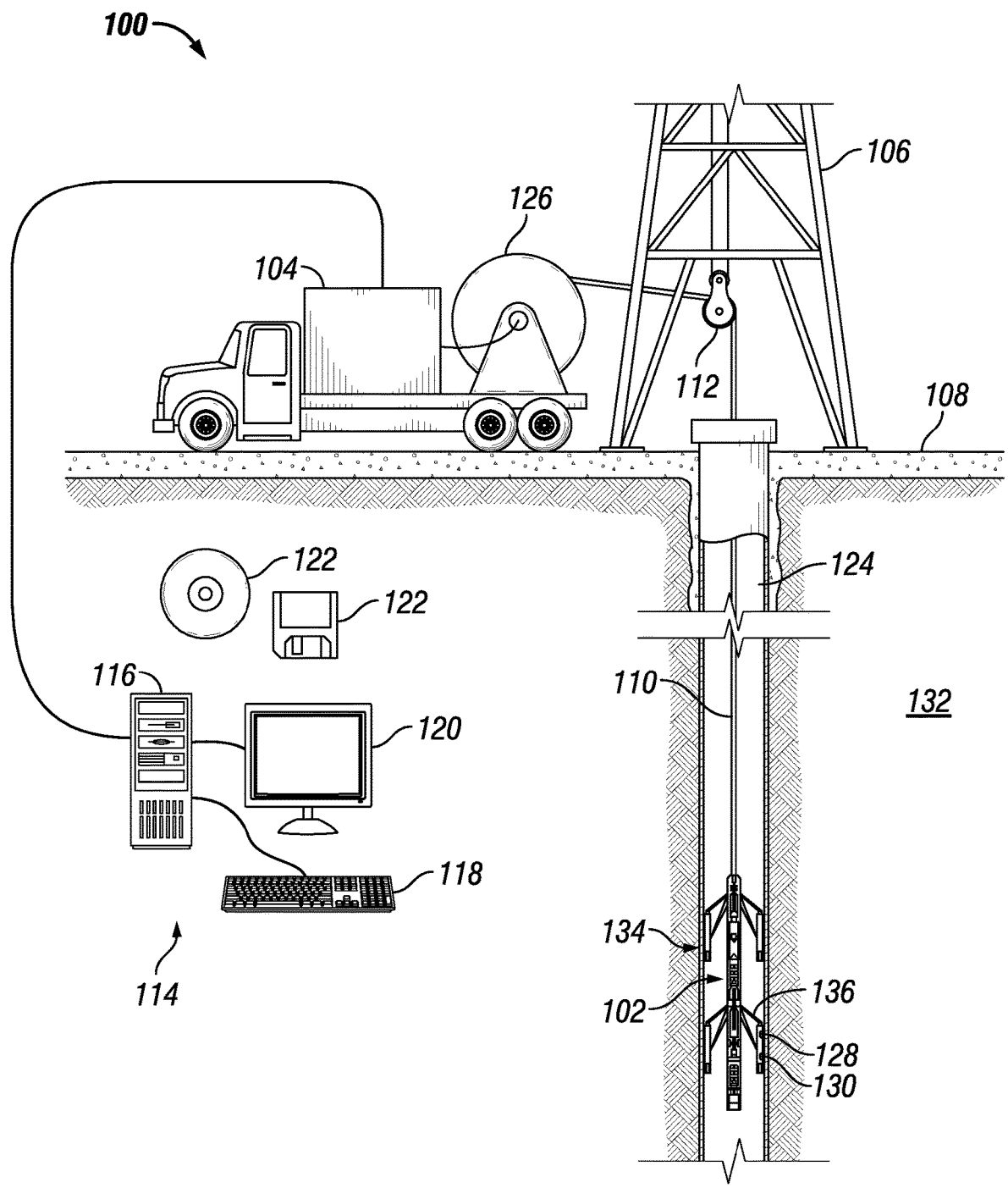
FIG. 1 illustrate an example of a well measurement system.

FIG. 1 illustrates a cross-sectional view of a well measurement system 100. As illustrated, well measurement system 100 may comprise downhole tool 102 attached to a vehicle 104. In examples, it should be noted that downhole tool 102 may not be attached to a vehicle 104. Downhole tool 102 may be supported by rig 106 at surface 108. Downhole tool 102 may be tethered to vehicle 104 through conveyance 110. Conveyance 110 may be disposed around one or more sheave wheels 112 to vehicle 104. Conveyance 110 may include any suitable means for providing mechanical conveyance for downhole tool 102, including, but not limited to, wireline, slickline, coiled tubing, pipe, drill pipe, drill string, downhole tractor, or the like. In some examples, conveyance 110 may provide mechanical suspension, as well as electrical connectivity, for downhole tool 102. Conveyance 110 may comprise, in some instances, a plurality of electrical conductors extending from vehicle 104. Conveyance 110 may comprise an inner core of seven electrical conductors covered by an insulating wrap. An inner and outer steel armor sheath may be wrapped in a helix in opposite directions around the conductors. The electrical conductors may be used for communicating power and telemetry between vehicle 104 and downhole tool 102. Information from downhole tool 102 may be gathered and/or processed by information handling system 114. For example, signals recorded by downhole tool 102 may be stored on memory and then processed by downhole tool 102. The processing may be performed real-time during data acquisition or after recovery of downhole tool 102. Processing may alternatively occur downhole or may occur both downhole and at surface. In some examples, signals recorded by downhole tool 102 may be conducted to information handling system 114 by way of conveyance 110. Information handling system 114 may process the signals, and the information contained therein may be displayed for an operator to observe and stored for future processing and reference. Information handling system 114 may also contain an apparatus for supplying control signals and power to downhole tool 102.

Systems and methods of the present disclosure may be implemented, at least in part, with information handling system 114. While shown at surface 108, information handling system 114 may also be located at another location, such as remote from borehole 124. Information handling system 114 may include any instrumentality or aggregate of instrumentalities operable to compute, estimate, classify, process, transmit, receive, retrieve, originate, switch, store, display, manifest, detect, record, reproduce, handle, or utilize any form of information, intelligence, or data for business, scientific, control, or other purposes. For example, an information handling system 114 may be a processing unit 116, a network storage device, or any other suitable device and may vary in size, shape, performance, functionality, and price. Information handling system 114 may include random access memory (RAM), one or more processing resources such as a central processing unit (CPU) or hardware or software control logic, ROM, and/or other types of nonvolatile memory. Additional components of the information handling system 114 may include one or more disk drives, one or more network ports for communication with external devices as well as an input device 118 (e.g., keyboard, mouse, etc.) and video display 120. Information handling system 114 may also include one or more buses operable to transmit communications between the various hardware components.

Alternatively, systems and methods of the present disclosure may be implemented, at least in part, with non-transitory computer-readable media 122. Non-transitory computer-readable media 122 may include any instrumentality or aggregation of instrumentalities that may retain data and/or instructions for a period of time. Non-transitory computer-readable media 122 may include, for example, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such as wires, optical fibers, microwaves, radio waves, and other electromagnetic and/or optical carriers; and/or any combination of the foregoing.

As discussed below, methods may be utilized by information handling system 114 to determine and display a high resolution resistivity image of formation 132 immediately surrounding borehole 124. This high resolution resistivity image may depict boundaries of subsurface structures, such as a plurality of layers disposed in formation 132. These images may be used in reservoir characterization. Images with high resolution may allow accurate identification of thin beds and other fine features such as fractures, clasts and vugs. These images may provide information about the sedimentology, lithology, porosity and permeability of formation 132. The images may complement, or in some cases replace, the process of coring.

In examples, rig 106 includes a load cell (not shown) which may determine the amount of pull on conveyance 110 at the surface of borehole 124. Information handling system 114 may comprise a safety valve which controls the hydraulic pressure that drives drum 126 on vehicle 104 which may reels up and/or release conveyance 110 which may move downhole tool 102 up and/or down borehole 124. Conveyance 110 may provide a means of disposing downhole tool 102 into borehole 124. The safety valve may be adjusted to a pressure such that drum 126 may only impart a small amount of tension to conveyance 110 over and above the tension necessary to retrieve conveyance 110 and/or downhole tool 102 from borehole 124. The safety valve is typically set a few hundred pounds above the amount of desired safe pull on conveyance 110 such that once that limit is exceeded; further pull on conveyance 110 may be prevented.

Downhole tool 102 may comprise a button array 128 and/or a return electrode 130. Button array 128 and/or return electrode 130 may be disposed on at least one pad 134 in any suitable order. For example, a pad 134 may include only button arrays 128 and/or return electrodes 130. Further, a pad 134 may comprise both button array 128 and return electrodes 130. Pads 134 may be attached to at least one arm 136 that may extend from downhole tool 102. Arm 136 may extend pad 134 away from downhole tool 102. In examples, arm 136 may place pad 134 in contact with borehole 124. It should be noted that there may be a plurality of arms 136. One or more arms 136 may place an arrangement of button arrays 128 and/or return electrode 130 in close proximity to the wall of borehole 124.

In examples, downhole tool 102 may operate with additional equipment (not illustrated) on surface 108 and/or disposed in a separate well measurement system (not illustrated) to record measurements and/or values from formation 132.

Figure 2:
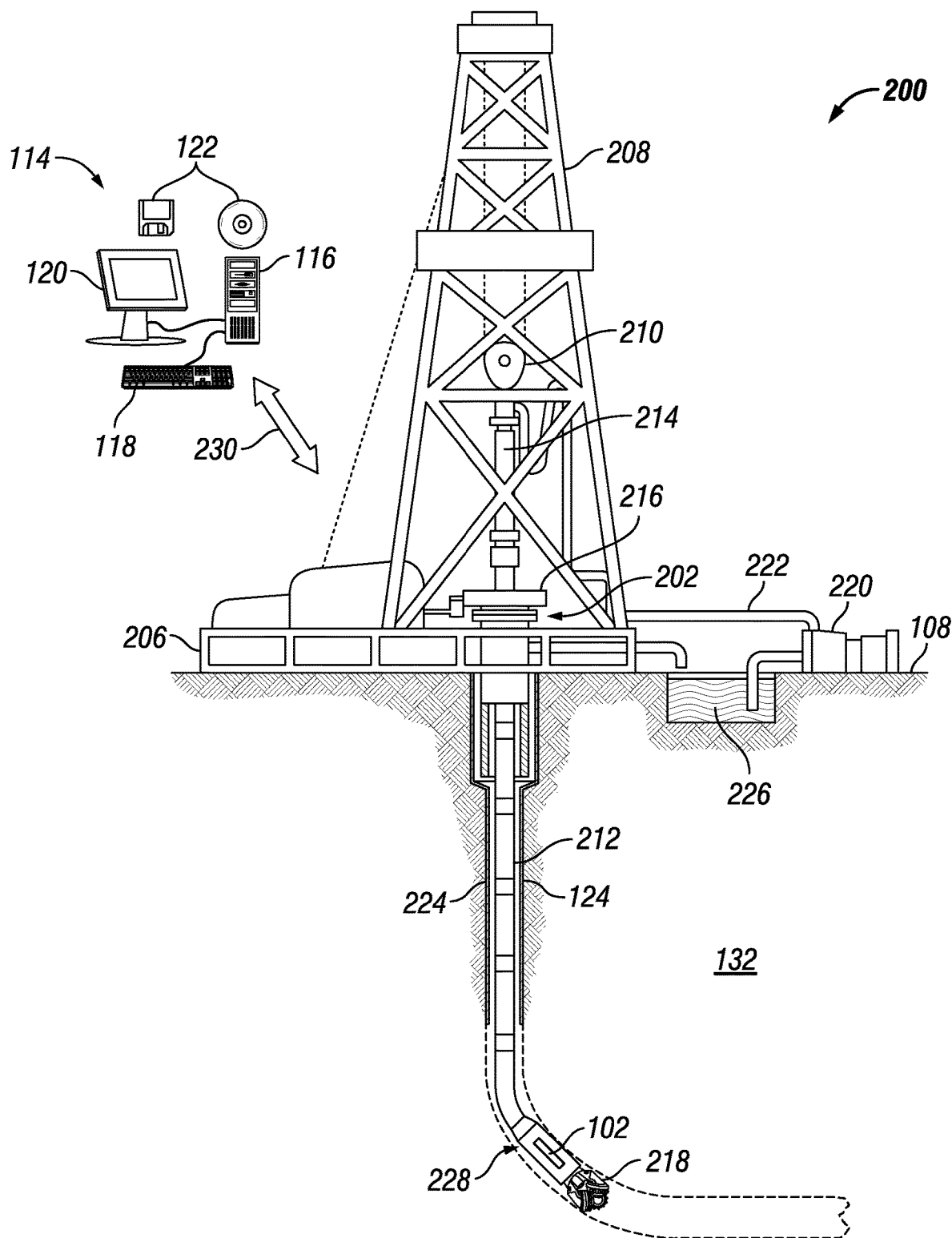
FIG. 2 illustrates another example of a well measurement system.

FIG. 2 illustrates an example in which downhole tool 102 (Referring to FIG. 1) may be disposed in a drilling system 200. As illustrated, borehole 124 may extend from a wellhead 202 into formation 132 from surface 108 (Referring to FIG. 1). Generally, borehole 124 may include horizontal, vertical, slanted, curved, and other types of borehole geometries and orientations. Imaging tools may be used in uncased sections of the borehole. Measurements may be made by imaging tools in cased sections for purposes such as calibration.

As illustrated, borehole 124 may extend through formation 132. As illustrated in FIG. 2, borehole 124 may extend generally vertically into the formation 132, however borehole 124 may extend at an angle through formation 132, such as horizontal and slanted boreholes. For example, although FIG. 2 illustrates a vertical or low inclination angle well, high inclination angle or horizontal placement of the well and equipment may be possible. It should further be noted that while FIG. 2 generally depicts a land-based operation, those skilled in the art may recognize that the principles described herein are equally applicable to subsea operations that employ floating or sea-based platforms and rigs, without departing from the scope of the disclosure.

As illustrated, a drilling platform 206 may support a derrick 208 having a traveling block 210 for raising and lowering drill string 212. Drill string 212 may include, but is not limited to, drill pipe and coiled tubing, as generally known to those skilled in the art. A kelly 214 may support drill string 212 as it may be lowered through a rotary table 216. A drill bit 218 may be attached to the distal end of drill string 212 and may be driven either by a downhole motor and/or via rotation of drill string 212 from surface 108. Without limitation, drill bit 218 may include, roller cone bits, PDC bits, natural diamond bits, any hole openers, reamers, coring bits, and the like. As drill bit 218 rotates, it may create and extend borehole 124 that penetrates various formations 132. A pump 220 may circulate drilling fluid through a feed pipe 222 to kelly 214, downhole through interior of drill string 212, through orifices in drill bit 218, back to surface 108 via annulus 224 surrounding drill string 212, and into a retention pit 226.

With continued reference to FIG. 2, drill string 212 may begin at wellhead 202 and may traverse borehole 124. Drill bit 218 may be attached to a distal end of drill string 212 and may be driven, for example, either by a downhole motor and/or via rotation of drill string 212 from surface 108 (Referring to FIG. 1). Drill bit 218 may be a part of bottom hole assembly 228 at distal end of drill string 212. Bottom hole assembly 228 may further comprise downhole tool 102 (Referring to FIG. 1). Downhole tool 102 may be disposed on the outside and/or within bottom hole assembly 228. Downhole tool 102 may comprise test cell 234. As will be appreciated by those of ordinary skill in the art, bottom hole assembly 228 may be a measurement-while drilling (MWD) or logging-while-drilling (LWD) system.

Without limitation, bottom hole assembly 228 may be connected to and/or controlled by information handling system 114 (Referring to FIG. 1), which may be disposed on surface 108. Without limitation, information handling system 114 may be disposed down hole in bottom hole assembly 228. Processing of information recorded may occur down hole and/or on surface 108. Processing occurring downhole may be transmitted to surface 108 to be recorded, observed, and/or further analyzed. Additionally, information recorded on information handling system 114 that may be disposed down hole may be stored until bottom hole assembly 228 may be brought to surface 108. In examples, information handling system 114 may communicate with bottom hole assembly 228 through a fiber optic cable (not illustrated) disposed in (or on) drill string 212. In examples, wireless communication may be used to transmit information back and forth between information handling system 114 and bottom hole assembly 228. Information handling system 114 may transmit information to bottom hole assembly 228 and may receive as well as process information recorded by bottom hole assembly 228. In examples, a downhole information handling system (not illustrated) may include, without limitation, a microprocessor or other suitable circuitry, for estimating, receiving and processing signals from bottom hole assembly 228. Downhole information handling system (not illustrated) may further include additional components, such as memory, input/output devices, interfaces, and the like. In examples, while not illustrated, bottom hole assembly 228 may include one or more additional components, such as analog-to-digital converter, filter and amplifier, among others, that may be used to process the measurements of bottom hole assembly 228 before they may be transmitted to surface 108. Alternatively, raw measurements from bottom hole assembly 228 may be transmitted to surface 108.

Any suitable technique may be used for transmitting signals from bottom hole assembly 228 to surface 108, including, but not limited to, wired pipe telemetry, mud-pulse telemetry, acoustic telemetry, and electromagnetic telemetry. While not illustrated, bottom hole assembly 228 may include a telemetry subassembly that may transmit telemetry data to surface 108. Without limitation, an electromagnetic source in the telemetry subassembly may be operable to generate pressure pulses in the drilling fluid that propagate along the fluid stream to surface 108. At surface 108, pressure transducers (not shown) may convert the pressure signal into electrical signals for a digitizer (not illustrated). The digitizer may supply a digital form of the telemetry signals to information handling system 114 via a communication link 230, which may be a wired or wireless link. The telemetry data may be analyzed and processed by information handling system 114.

As illustrated, communication link 230 (which may be wired or wireless, for example) may be provided that may transmit data from bottom hole assembly 228 to an information handling system 114 at surface 108. Information handling system 114 may include a processing unit 116 (Referring to FIG. 1), a video display 120 (Referring to FIG. 1), an input device 118 (e.g., keyboard, mouse, etc.) (Referring to FIG. 1), and/or non-transitory computer-readable media 122 (e.g., optical disks, magnetic disks) (Referring to FIG. 1) that may store code representative of the methods described herein. In addition to, or in place of processing at surface 108, processing may occur downhole.

Figure 3:
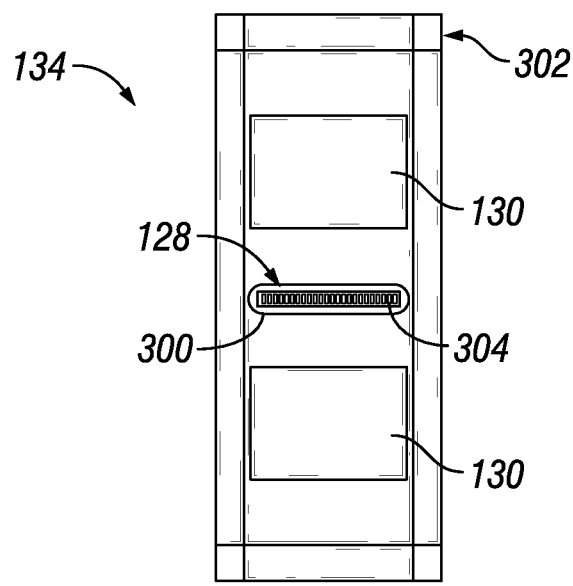
FIG. 3 illustrates an example of a pad.

FIG. 3 illustrates an example of pad 134. Pad 134 may serve to place button array 128 and/or return electrode 130 in contact with or in close proximity to borehole 124. Pad 134 may comprise a button array 128, a return electrode 130, a guard 300, and a housing 302. In examples, there may be a plurality of button arrays 128. Button array 128 may comprise a button electrode 304, wherein button electrode 304 may be a sensor that senses impedance of formation 132. There may be any suitable number of button electrodes 304 within button array 128 that may produce a desired, predetermined current. Without limitation, the range for a suitable number of button electrodes 304 within button array 128 may be from about one button electrode 304 to about one hundred button electrodes 304. For example, the range for a suitable number of button electrodes 304 within button array 128 may be from about one button electrode 304 to about twenty-five button electrodes 304, from about twenty-five button electrodes 304 to about fifty button electrodes 304, from about fifty button electrodes 304 to about seventy-five button electrodes 304, or from about seventy-five button electrodes 304 to about one hundred button electrodes 304.

In examples, there may be a plurality of return electrodes 130. One of the return electrodes 130 may be disposed on one side of button array 128, and another one of the return electrodes 130 may be disposed on the opposite side of button array 128. These return electrodes 130 may be disposed at equal distances away from button array 128 or at varying distances from button array 128. In examples, a voltage difference between button array 128 and return electrodes 130 may be applied, which may cause currents to be emitted from button array 128 into the mud (not illustrated) and formation 132 (referring to FIG. 1).

During operations, an operator may energize button array 128. A voltage may be applied between each button electrode 304 and return electrode 130. The level of the voltage may be controlled by information handling system 114. This may cause currents to be transmitted through button array 128. These currents may travel through the mud and formation 132 and may reach back to return electrode 130. The amount of current emitted by each button electrode 304 may be inversely proportional to the impedance seen by that button electrode 304. This impedance may be affected by the properties of formation 132 and the mud directly in front of each button electrode 304. Therefore, current emitted by each button electrode 304 may be measured and recorded in order to obtain an image of the resistivity of formation 132.

In examples, a current may be transmitted from a transmitting electrode and return to return electrode 130. These two electrodes may be referred to as the current electrodes. Then, the voltage drop across a set of button electrodes (e.g., button array 128) may be measured and used to estimate the impedance of formation 132. In these alternative implementations, button electrodes 304 may be referred to as voltage electrodes or monitor electrodes. Proposed method may operate in any of the two designs above or any other similar oil based mud resistivity imager tool without any limitations. In the rest of the text, the imager tool will be assumed to be of the first design without any loss of generality.

Guard 300 may help to focus most of the current produced by button array 128 into formation 132 radially. Guard 300 may be disposed around button array 128. Guard 300 may include the same potential as button array 128.

In examples, housing 302 may serve to protect button array 128 and return electrodes 130 from the surrounding mud and formation 132. Housing may be made with any suitable material. Without limitation, suitable material may be metals, nonmetals, plastics, ceramics, composites and/or combinations thereof In examples, housing 302 may be a metal plate. Housing 302 may be connected through arm 136 to downhole tool 102 (referring to FIG. 1). An insulating material may be used to fill the remaining portions of pad 134. In examples, ceramics may be used as the insulating material to fill the remaining portions of pad 134.

An impedance value may be calculated through the current transmitting between a button electrode 304 and formation 132 for each button electrode 304. The voltage between button array 128 and return electrodes 130 may be measured and divided by the transmitted current to produce a value for the impedance seen by each button electrode 304. Most of the transmitted current may be returned to return electrodes 130 although some portions of it may return through housing 302 and downhole tool 102 (referring to FIG. 1).

Figure 4:
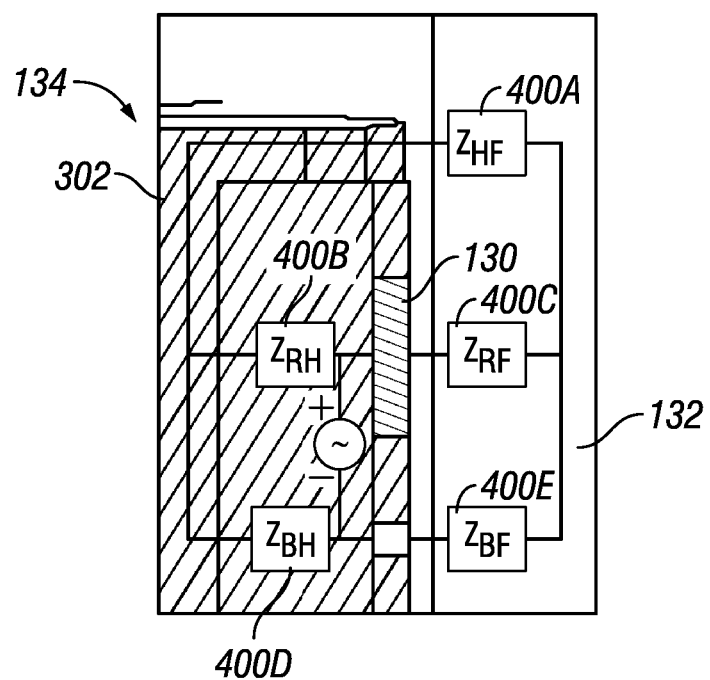
FIG. 4 illustrates an example of a circuit model of a downhole tool.

FIG. 4 illustrates an example of a circuit model that may approximate the downhole tool 102. Effects of the transmitted current may be approximately characterized by a housing-to-formation impedance value 400A, a return electrode-to-housing impedance value 400B, a return electrode-to-formation impedance value 400C, a button array-to-housing impedance value 400D, and a button array-to-formation impedance value 400E. Impedance may be calculated below, wherein Z is the impedance, $V_{BR}$ is the button array to return electrode voltage and $I_B$ is the button array current:

$$Z = \frac{V_{BR}}{I_B} \quad (1)$$

The value calculated in Equation 1 may be equal to $Z_{BF}+Z_{RF}$, as shown in FIG. 4, wherein $Z_{BF}$ is the impedance from button array 128 to formation 132 and $Z_{RF}$ is the impedance of return electrode 130 to formation 132. Note that both $Z_{BF}$ and $Z_{RF}$ have contributions from both the surrounding mud and formation 132 (referring to FIG. 1). Thus, equivalently it can be written in Equation 2 as:

$$Z \approx Z_{BF} = Z_{mud} + Z_F \quad (2)$$

As a result, measured impedance may have contributions from both the mud and formation 132, wherein $Z_{mud}$ is the impedance of the mud and $Z_F$ is the impedance of formation 132. Imaginary parts of $Z_F$ and $Z_{mud}$ may be assumed to be mainly capacitive. Assuming this capacitance may be in parallel with the resistive portion, then $Z_{BF}$ may also be written as:

$$Z_{BF} = \frac{1}{\left(\frac{1}{R_M} + j\omega C_M\right)} + \frac{1}{\left(\frac{1}{R_F} + j\omega C_F\right)} \quad (3)$$

wherein $R_M$ is the mud resistance, $R_F$ is the resistance of formation 132, $C_M$ is the mud capacitance, $C_F$ is the capacitance of formation 132, j is the unit imaginary number, and $\omega$ is the angular frequency. Both the mud resistance and mud capacitance may increase as standoff increases and may decrease with the increase in effective area of button array 128. "Standoff" may be used to denote the distance of pad 134 from a wall of borehole 124 (referring to FIG. 1). Standoff may assume that pad 134 is movable while downhole tool 102 remains immobile. In examples, to achieve large distances from the wall of borehole 124, downhole tool 102 may be moved along with pad 134. In examples, the term "eccentricity" may be used instead of "standoff". The proposed methods (discussed further below) may be equally valid whether pad 134 moves or both pad 134 and downhole tool 102 move.

Figure 5:
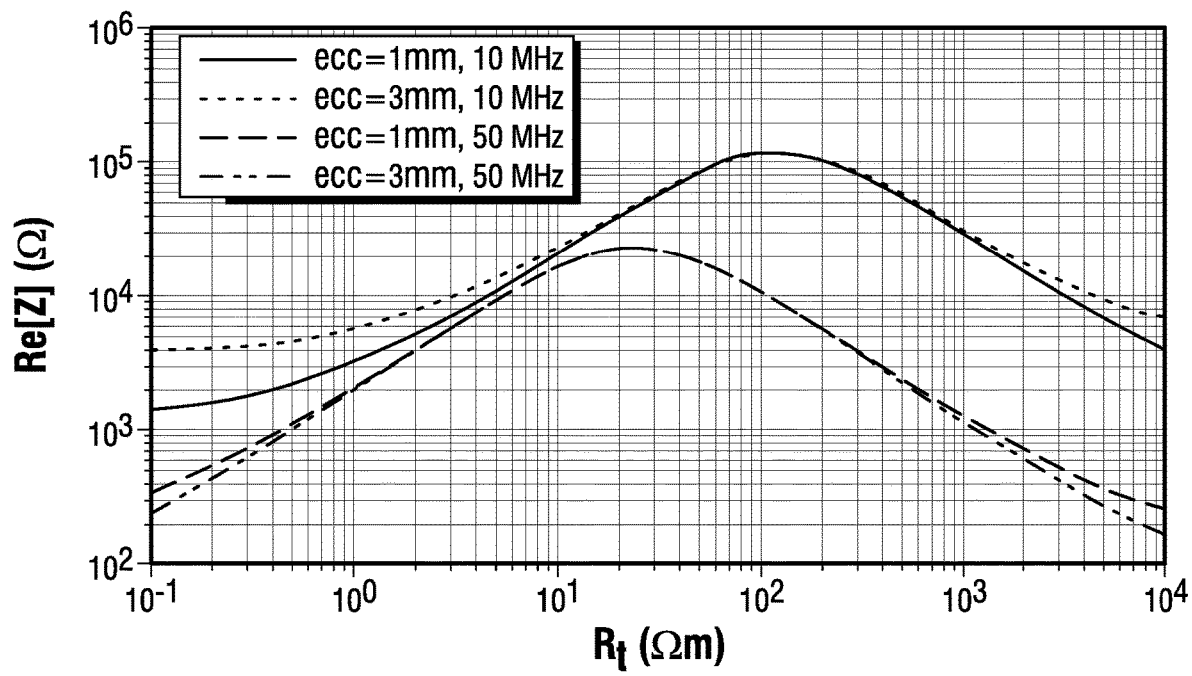
FIG. 5 illustrates a graph of the real part of the measured impedance versus the formation resistivity.

Equation 3 may be used to obtain basic performance curves for downhole tool 102. These basic performance curves may be fairly accurate in homogeneous formations 132. In FIG. 5, the real part of the measured impedance versus the formation resistivity may be illustrated on a graph. The imaginary part of the impedance may be determined by the mud capacitance; therefore, it may not be necessary to plot it. In examples, it may be assumed that formation permittivity (εF) is 15, mud permittivity (εM) is 6, and mud resistivity (ρM) is 8000 Ω-m. Results for two different frequencies (10 Mhz and 50 MHz) at two different eccentricities (ecc=1 mm and ecc=3 mm), where ecc stands for eccentricity of the tool, may be displayed in FIG. 5.

There may be a separation between different standoffs at lower formation resistivities. This effect may be more pronounced if the frequency is lower. At higher formation resistivities, the dielectric effect in formation 132 may cause a roll-off in measured impedance, as illustrated in FIG. 5. Operating in a linear region of the curve, displayed in FIG. 5, may produce a more accurate correspondence between the impedance image and that of the true formation resistivity. The standoff effect at low formation resistivities may cause an ambiguity in the interpretation of the impedance images. These raw measurements may be used, but the contrast of the resitivity image may be reduced. Furthermore, small errors in standoff measurements may cause a large difference in the impedance reading.

In examples, a method may be used that makes use of data obtained at different distances from the wall of borehole 124. The method may operate in a variety of environments and may not require closing pad 134 during logging (referring to FIG. 1), wherein closing is the configuration of pad 134 where arms 136 may be fully retracted from their extended positions such that pad 134 may be situated as close to downhole tool 102 as possible; generally in a groove on downhole tool 102. Natural variation in standoff may give the required data. However, making measurements before arms 136 press pad 134 to the wall of borehole 124 or some partial closing of arms 136 to move pad 134 away from the wall of borehole 124 may be required to improve the measurement accuracy.

Figure 6:
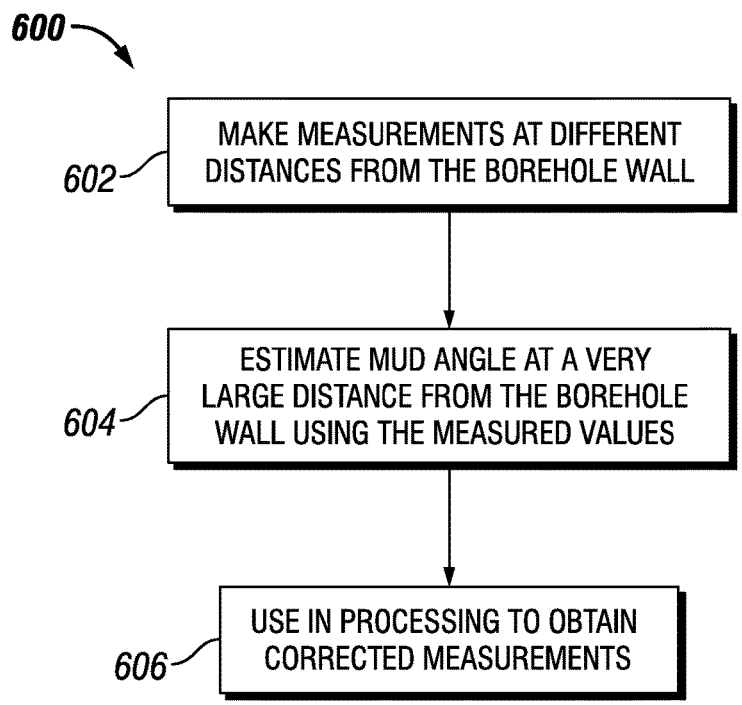
FIG. 6 illustrates an example of a flowchart for estimating mud angle.

FIG. 6 illustrates an example of an estimation of a mud angle flowchart 600 that may estimate a mud angle based on making measurements at different distances from the wall of borehole 124. An estimation of the mud angle at a distance that may be much greater than what may be measurable may be obtained by using measurements at different standoff values from the wall of borehole 124. First step 602 may comprise of making measurements at different distances from the wall of borehole 124. Downhole tool 102 (referring to FIG. 1) may make measurements by extending an arm 136 of downhole tool 102 to a first location, taking a first impedance measurement with at least one button electrode 304, extending an arm 136 to a second location, and taking a second impedance measurement with at least one button electrode 304. In examples, the process may further include extending an arm 136 to a third location, taking a third impedance measurement of at least one button electrode 304, extending an arm 136 to a fourth location, and taking a fourth impedance measurement of at least one button electrode 304. Pad 134 (referring to FIG. 1) may make measurements from a suitable range of distances from the wall of borehole 124. Without limitation, this suitable range of distances from the wall of borehole 124 may be from about 0 cm to about 15.24 cm. For example, the range may be from about 0 cm to about 3.81 cm, from about 3.81 cm to about 7.62 cm, from about 7.62 cm to about 11.43 cm, and from about 11.43 cm to about 15.24 cm. For example, pad 134 may take a first impedance measurement at 1.27 cm from the wall of borehole 124, a second impedance measurement at 1.524 cm from the wall of borehole 124, a third impedance measurement at 1.778 cm from the wall of borehole 124, and a fourth impedance measurement at 2.032 cm from the wall of borehole 124. In examples, an intermediary step between first step 602 and second step 604 may be transmitting the first impedance measurement and the second impedance measurement to information handling system 114. Second step 604 may comprise of estimating mud angle at a very large distance from the wall of borehole 124 using the measured values. The contribution of formation 132 to the measured impedance may decrease as the distance to the wall of borehole 124 increases. This may result in a more accurate determination from the original measurements. The estimation may be accurate as the impedance of formation 132 may not change rapidly between measurements. Estimating a mud angle may be done with at least a first impedance measurement and a second impedance measurement performed by information handling system 114 (referring to FIG. 1). Third step 606 may comprise using an estimated mud angle in post-processing to obtain corrected impedance measurements. This may produce a more accurate and better-quality impedance image of formation 132 (referring to FIG. 1). Information handling system 114 may display an image representing a resistivity of formation 132 around borehole 124. An operator may make a drilling logging completion or production decision based on the image produced through information handling system 114.

There may be many different implementations of the estimation process mentioned above in second step 604. In examples, a curve that fits the obtained measurements may be obtained using inversion. This may be defined as "fitting the curve." The curve may be a function of the distance from pad 134 from the wall of borehole 124 (e.g. eccentricity or standoff) that may approximate the measurements. This curve may be defined by:

$$\angle\{Z_{mud}\}^{model} = \frac{\alpha}{ecc^{\beta}} + \Phi \quad (4)$$

In Equation 4, $\angle\{Z_{mud}\}$ denotes the mud angle. In examples, the proposed curve may approximate the mud angle. It may be assumed that the mud angle has an inverse relationship with the eccentricity in this equation. There may be three variables for inversion in the proposed model of the curve: $\alpha$, $\beta$ and $\varphi$. These variables may be inverted in a way to minimize a cost function, where the cost function may be defined as the norm of the error between the measurements and the model:

$$\|\angle\{Z_{mud}\}^{mod\ el} - \angle\{Z_{mud}\}^{meas}\| \quad (5)$$

Downhole tool 102 may show different behaviors with respect to eccentricity, so the shape of the curve that fits the measurements may change based on the eccentricity. Inversion may be performed in a variety of ways, such as an iterative conjugate gradient inversion method and/or a search method. Weights and additional regularization terms may also be added to the inversion. The inversion process described above may be illustrated as a flowchart in FIG. 7.

Figure 7:
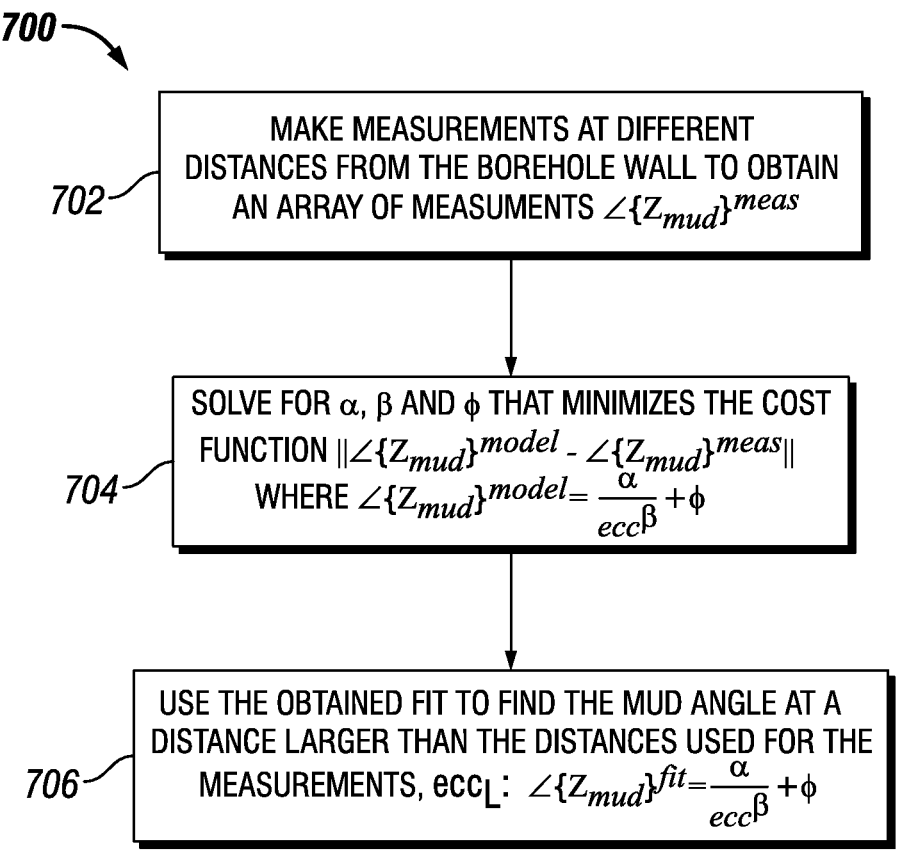
FIG. 7 illustrates an example of a flowchart to estimate the mud angle.

FIG. 7 illustrates an example of a flowchart 700 for a proposed method to estimate the mud angle. First step 702 may make measurements at different distances from the wall of borehole 124 to obtain an array of mud angle impedance measurements. Second step 704 may solve for $\alpha$, $\beta$ and $\varphi$ that minimizes Equation 5. Thirds step 706 may use the obtained fit to find the mud angle at a distance ($ecc_L^B$) larger than the distances used for measurements, $ecc_L$.

In examples, a case may be simulated using 3D EM modeling software. It may be assumed that formation permittivity ($\varepsilon F$) is 15, mud permittivity ($\varepsilon M$) is 6 and mud resistivity ($\rho M$) is 8000 $\Omega$-m. Numerical inaccuracies may introduce a "noise" to the measurements similar to what may be expected in real measurements.

Figure 8:
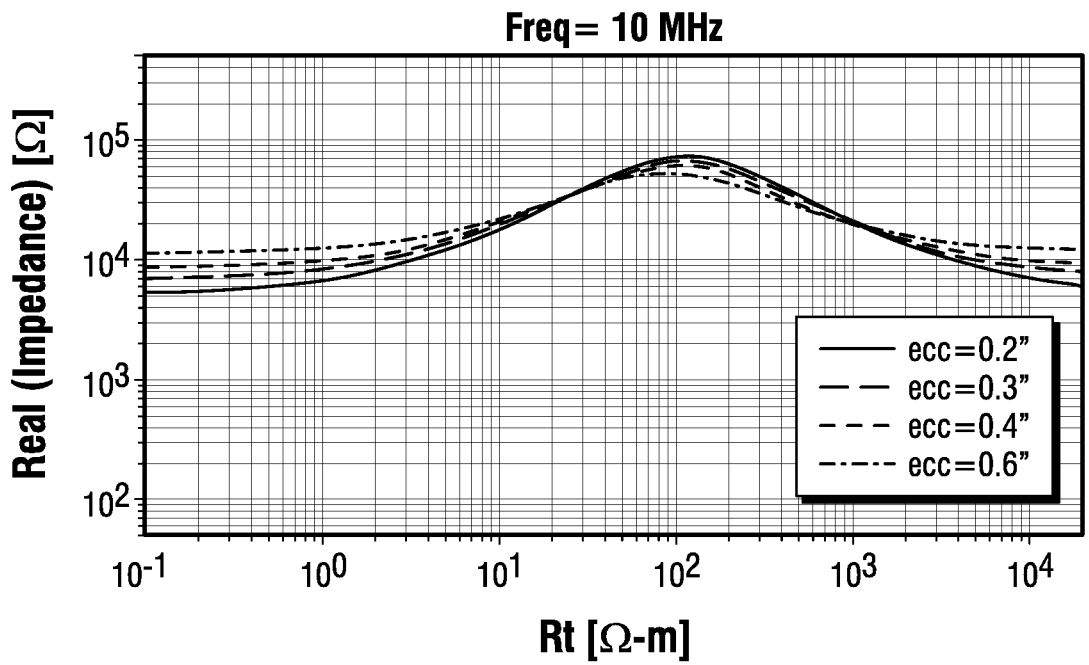
FIG. 8 illustrates a graph of the real part of the impedance versus the formation resistivity at a lower operating frequency.
Figure 9:
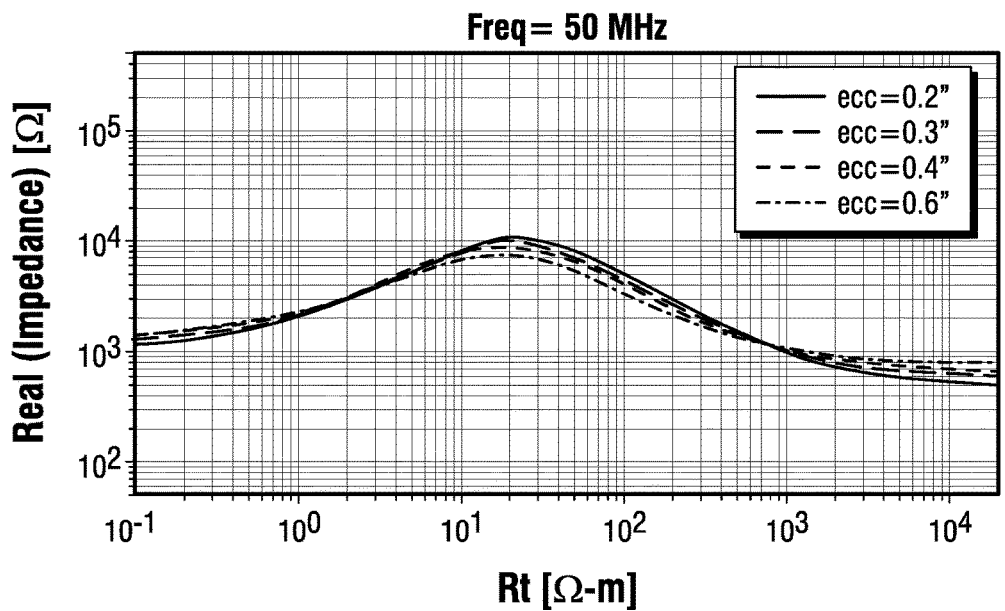
FIG. 9 illustrates a graph of the real part of the impedance versus the formation resistivity at a higher operating frequency.

In examples, four different distances to the wall of borehole 124 may be simulated: 0.508 cm, 0.762 cm, 1.016 cm and 1.524 cm. FIG. 8 illustrates a graph of the real part of the impedance seen by button array 128 versus the formation resistivity at a lower operating frequency. In examples, the lower operating frequency may be ten MHz. FIG. 9 illustrates the same result at a higher operating frequency. In examples, the higher operating frequency may be fifty MHz. It may be observed that the response may not be linear at low formation resistivities. Mud effect becomes more pronounced as the distance to the formation increases as expected.

Figure 10:
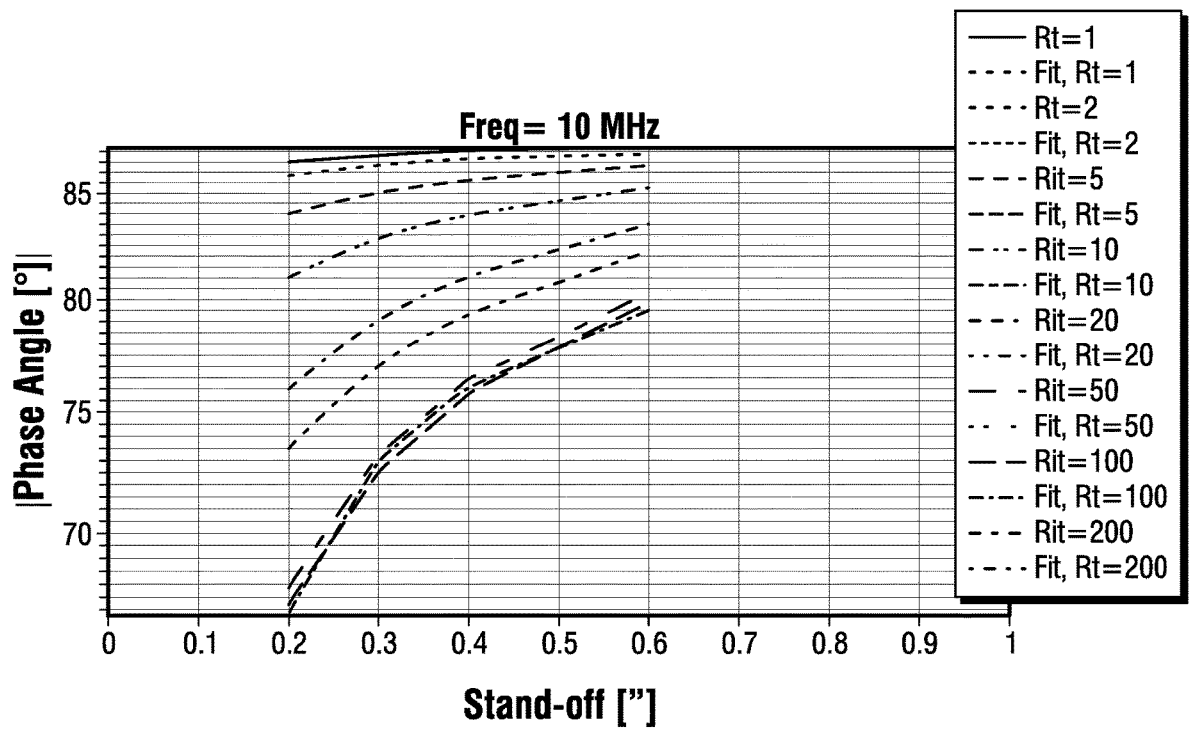
FIG. 10 illustrates a graph of a curve fitted for a variety of formation resistivities at a lower operating frequency.
Figure 11:
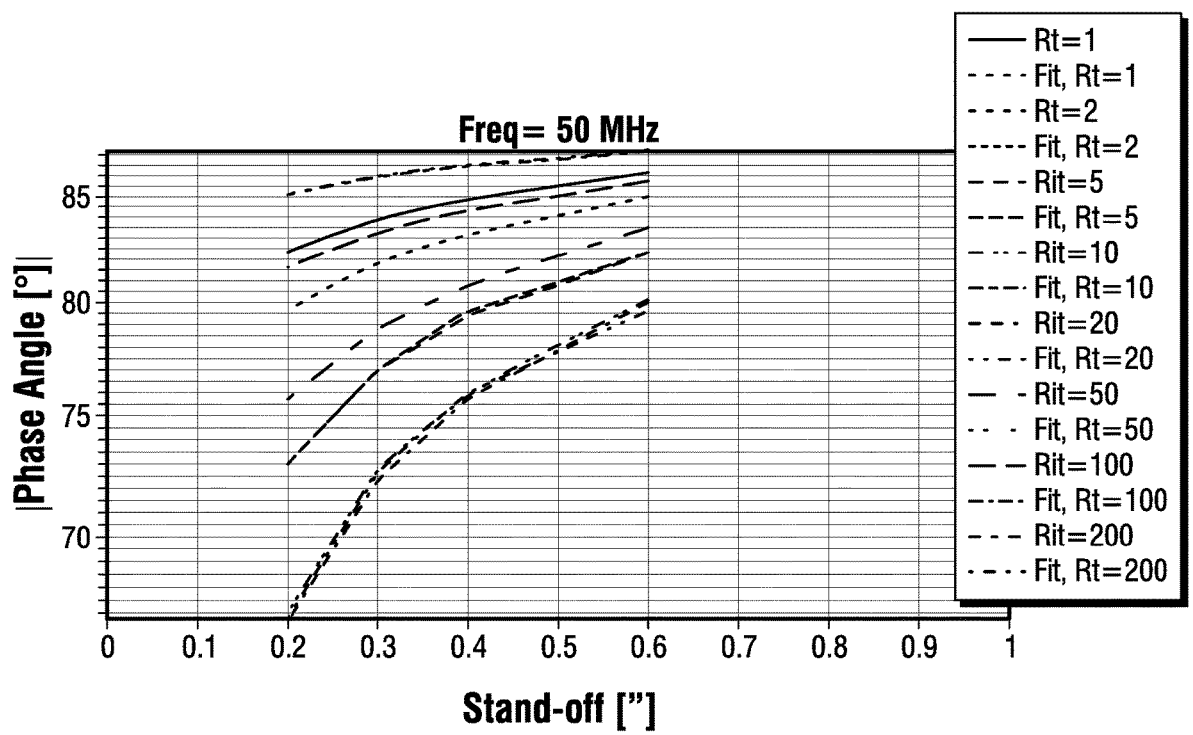
FIG. 11 illustrates a graph of a curve fitted for a variety of formation resistivities at a higher operating frequency.

In FIGS. 10 and 11, simulations may be compared with the curve fit obtained by the procedure discussed in FIG. 7 for a variety of formation resistivities for a lower operating frequency and a higher operating frequency, respectively. It may be observed that a good fit approximating the measurements with a high degree of accuracy may be obtained.

Figure 12:
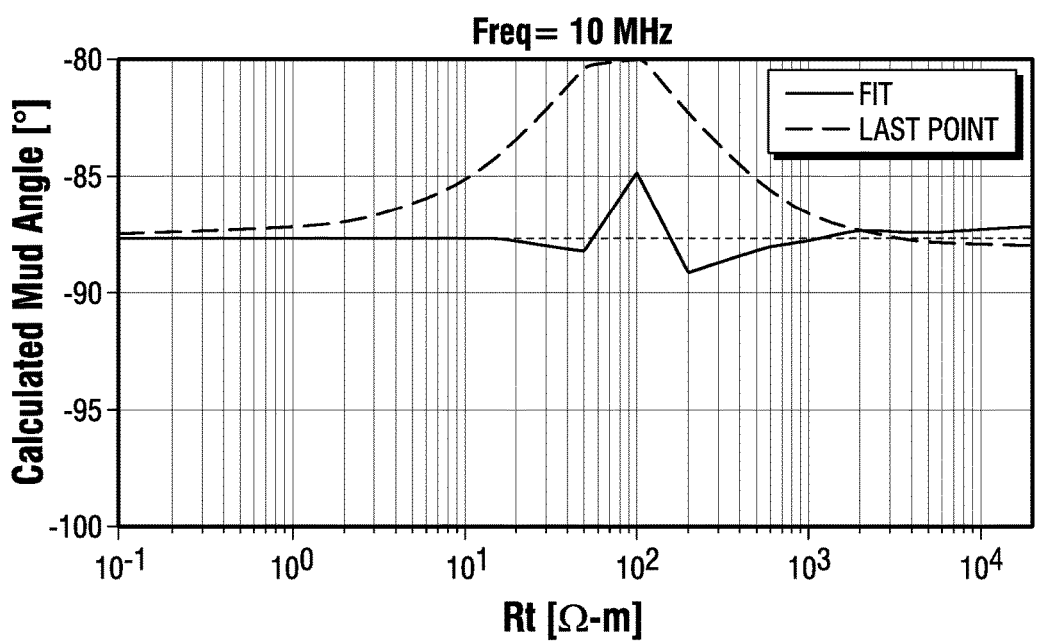
FIG. 12 illustrates a graph comparing the estimated mud angle against the measured value at a large distance from the borehole at a lower operating frequency.
Figure 13:
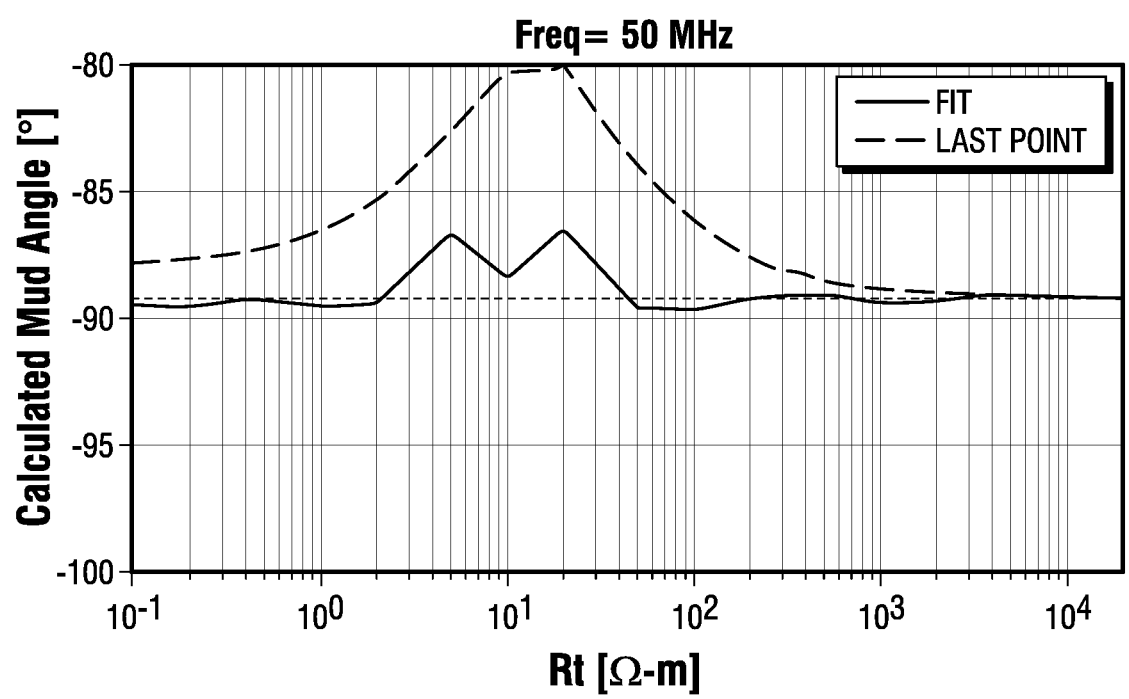
FIG. 13 illustrates a graph comparing the estimated mud angle against the measured value at a large distance from the borehole at a higher operating frequency.

By using this fit, the expected value of the mud angle at 5.08 cm away from the borehole may be evaluated. A larger distance may be used, but small errors in the fitted curve may lead to very large errors if the speculated distance is too large. The result may be compared with the angle of measurement at ecc=1.524 cm (the measurement furthest from the borehole wall which should primarily be reading the mud, i.e. the last data point) in FIGS. 12 and 13 for a lower operating frequency and a higher operating frequency, respectively. It may be seen that this simple inversion process may lead to an improvement in the determined mud angle for a majority of the formation resistivities.

In examples, other methods may be utilized in place of the inversion. For example, interpolation may be used. The mud angle at a larger eccentricity may be estimated from existing mud angle measurements using a simple interpolation process. Without limitation, a simple interpolation process may be piecewise constant, linear, polynomial, spline interpolation and/or combinations thereof. This may be similar to the curve fit implementation described above but may not require an inversion.

In examples, a difference between measurements may be used in place of the actual measurements. Equation 3 provided circuit equations that may describe the operation of downhole tool 102 (referring to FIG. 1). To a good approximation, contributions of formation 132 in Equation 3 may be assumed to be independent of the standoff. Thus, taking the difference between two measurements may give a value that is mainly proportional to the mud angle, as shown in Equation 6. The result may be used directly, or a curve fitting process on the difference measurements may be applied to further improve the results.

$$\angle\{Z_{meas}(ecc_2) - Z_{meas}(ecc_1)\} \approx \angle\{Z_{mud}\} \quad (6)$$

In examples, a matrix solution may be used in place of the inversion. Measurements may be manipulated to solve for a variable by using a matrix solution to determine the mud angle based on the circuit approximation of the response of downhole tool 102 (referring to FIG. 1). For example, as shown in Equation 7, measured impedance may be written as a combination of mud impedance and impedance of formation 132. Mud impedance may be assumed to be changing linearly with eccentricity, while the formation component may be assumed to be constant as discussed above. The formation component may also have a weak inverse dependence on eccentricity due to the current spreading out more in the mud at a longer distance from the wall of borehole 124. A matrix equation may be manipulated, wherein $K_F$ is a constant component of the formation, to determine a constant component of the mud $K_{mud}$, whose phase angle ($\angle K_{mud}$) should be a very good approximation to the mud angle. A solution may be formed as shown in Equation 10, where indices 1 through N denote measurements made at different distances from the wall of borehole 124.

$$Z_{meas} \approx Z_{mud} + Z_F \quad (7)$$

$$Z_{meas} \approx K_{mud} \times ecc + \frac{K_F}{ecc} \quad (8)$$

$$\begin{bmatrix} ecc_1 & 1/ecc_1 \\ ecc_N & 1/ecc_N \end{bmatrix} \begin{bmatrix} K_{mud} \\ K_F \end{bmatrix} = \begin{bmatrix} Z_{meas1} \\ Z_{measN} \end{bmatrix} \quad (9)$$

$$\angle Z_{mud} \approx \angle K_{mud} \quad (10)$$

In examples, as an extension of the matrix solution described above, a multi-frequency matrix solution may be implemented if such data is available. In this example, real and imaginary parts of the mud angle may be solved individually. Real parts (Re) may be assumed to be frequency independent as in Equation 12, while imaginary parts (Im) may be assumed to follow a capacitive behavior as in Equation 14. Solutions may be combined at the end to solve for the mud angle at a desired frequency as shown in Equation 15, whose phase angle should be a very good approximation to the mud angle. In the following equations, "f" is frequency. The index of frequency (i.e. 1, 2, etc.) denotes the discrete operation frequencies of downhole tool 102 where it is assumed that there are a total of "k" frequencies.

$$Re\{Z_{meas}\} \approx Re\{K_{mud} \times ecc\} + Re\left\{\frac{K_F}{ecc}\right\} \quad (11)$$

$$\begin{bmatrix} ecc_1 & 1/ecc_1 \\ ecc_N & 1/ecc_N \\ ecc_1 & 1/ecc_1 \\ ecc_N & 1/ecc_N \end{bmatrix} \begin{bmatrix} Re\{K_{mud}\} \\ Re\{K_F\} \end{bmatrix} = \begin{bmatrix} Re\{Z_{measf1}\} \\ Re\{Z_{measNf1}\} \\ Re\{Z_{measf2}\} \\ Re\{Z_{measNf2}\} \end{bmatrix} \quad (12)$$

$$Im\{Z_{meas}\} \approx Im\left\{K_{mud} \times \frac{ecc}{f}\right\} + Im\left\{\frac{K_F}{ecc \times f}\right\} \quad (13)$$

$$\begin{bmatrix} ecc_1/f_1 & 1/(ecc_1/f_1) \\ (ecc_N \times f_1) & 1/(ecc_N \times f_1) \\ (ecc_1 \times f_2) & 1/(ecc_1 \times f_2) \\ (ecc_N \times f_K) & 1/(ecc_N \times f_K) \end{bmatrix} \begin{bmatrix} Im\{K_{mud}\} \\ Im\{K_F\} \end{bmatrix} = \begin{bmatrix} Im\{Z_{meas1,f1}\} \\ Im\{Z_{measN,f1}\} \\ Im\{Z_{meas1,f2}\} \\ Im\{Z_{measN,fK}\} \end{bmatrix} \quad (14)$$

$$K_{mud} = Re\{K_{mud}\} + Im\{K_{mud}\} \quad (15)$$

$$\angle Z_{mud} \approx \angle K_{mud} \quad (10)$$

Any and all combinations of the previously described methods and examples may be used in order to estimate a mud angle. This information may be processed by information handling system 114 to provide more accurate information to an operator. Information handling system 114 may display a high resolution resistivity image of wall of borehole 124, which may be utilized in the process of hydrocarbon recovery. The image may show fine features of formation 132 surrounding borehole 124.

The systems and methods to estimate the mud angle may include any of the various features of the systems and methods disclosed herein, including one or more of the following statements.

Statement 1. A method for estimating a mud angle, comprising: disposing a downhole tool into a borehole; extending an arm of the downhole tool to a first location, wherein a pad is disposed on the arm; taking a first impedance measurement with at least one button electrode, wherein the button electrode is disposed in a button array, wherein the button array is disposed on the pad; extending the arm to a second location; taking a second impedance measurement with the at least one button electrode; transmitting the first impedance measurement and the impedance second measurement to an information handling system; and estimating the mud angle from the first impedance measurement and the second impedance measurement with an information handling system.

Statement 2. The method of statement 1, further comprising utilizing the first impedance measurement and the second impedance measurement in an inversion process to determine a curve that approximates angle of impedance as a function of distance from a borehole wall.

Statement 3. The method of statement 2, further comprising using the curve to determine the mud angle, constructing an image representative of a resistivity of a formation around the borehole based, at least in part, on the mud angle, and utilizing an estimated mud angle to improve display of the image.

Statement 4. The method of any of the preceding statements, wherein the estimating the mud angle comprises using an interpolation process.

Statement 5. The method of any of the preceding statements, wherein the estimating the mud angle comprises taking a difference between the first measurement and the second measurement, wherein the difference is mainly proportional to mud impedance.

Statement 6. The method of statement 5, wherein the difference is used to graph a curve of angle of impedance versus distance from a borehole wall.

Statement 7. The method of statement 6, further comprising fitting the curve to determine the mud angle, constructing an image representative of a resistivity of a formation around the borehole based, at least in part, on the mud angle, and utilizing an estimated mud angle to improve display of the image.

Statement 8. The method of any of the preceding statements, further comprising: extending the arm to a third location; taking a third impedance measurement of the at least one button electrode; and transmitting the third impedance measurement to the information handling system.

Statement 9. The method of statement 8, further comprising: extending the arm to a fourth location; taking a fourth impedance measurement of the at least one button electrode; and transmitting the fourth impedance measurement to the information handling system.

Statement 10. The method of statement 9, using the first impedance measurement, the second impedance measurement, the third impedance measurement, and the fourth impedance measurements to estimate the mud angle.

Statement 11. A system for determining a formation boundary, comprising: a downhole tool, wherein the downhole tool comprises: an arm; and a pad, wherein the pad comprises a button array and at least one return electrode; a conveyance; and an information handling system, wherein the information handling system is configured to: extend an arm of the downhole tool to a first location, wherein the pad is disposed on the arm; take a first impedance measurement with at least one button electrode, wherein the button electrode is disposed in the button array, wherein the button array is disposed on the pad; extend the arm to a second location; take a second impedance measurement with the at least one button electrode; and estimate a mud angle from a first impedance measurement and a second impedance measurement.

Statement 12. The system of statement 11, wherein the conveyance is a wireline, wherein the downhole tool is disposed on a wireline.

Statement 13. The system of statement 11 or 12, wherein the conveyance is a drill string, wherein a bottom hole assembly is disposed on the drill string, wherein the downhole tool is disposed in the bottom hole assembly.

Statement 14. The system of any of statements 11 to 13, wherein the information handling system is further configured to utilize the first impedance measurement and the second impedance measurement in an inversion to determine a curve that approximates angle of impedance as a function of distance from a borehole wall.

Statement 15. The system of statement 14, wherein the information handling system is further configured to use the curve to determine the mud angle, construct an image representative of a resistivity of a formation around a borehole based, at least in part, on the mud angle, and to utilize an estimated mud angle to improve display of the image.

Statement 16. The system of any of statements 11 to 15, wherein the information handling system is further configured to estimate the mud angle using an interpolation process.

Statement 17. The system of any of statements 11 to 16, wherein the information handling system is further configured to estimate the mud angle by taking a difference between the first impedance measurement and the second impedance measurement, wherein the difference is mainly proportional to mud impedance.

Statement 18. The system of statement 17, wherein the difference is used to graph a curve of angle of impedance versus distance from a borehole wall.

Statement 19. The system of statement 18, wherein the information handling system is further configured to fit the curve to determine the mud angle, construct an image representative of a resistivity of a formation around a borehole based, at least in part, on the mud angle, and to utilize an estimated mud angle to improve display of the image.

Statement 20. The system of any of statements 11 to 19, wherein the information handling system is further configured to use the first impedance measurement, the second impedance measurement, a third impedance measurement, and a fourth impedance measurement to estimate the mud angle.

Although the present invention and its advantages have been described in detail, it should be understood that various changes, substitutions and alterations may be made herein without departing from the spirit and scope of the invention as defined by the appended claims. The preceding description provides various examples of the systems and methods of use disclosed herein which may contain different method steps and alternative combinations of components. It should be understood that, although individual examples may be discussed herein, the present disclosure covers all combinations of the disclosed examples, including, without limitation, the different component combinations, method step combinations, and properties of the system. It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the element that it introduces.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present examples are well adapted to attain the ends and advantages mentioned as well as those that are inherent therein. The particular examples disclosed above are illustrative only, and may be modified and practiced in different but equivalent manners apparent to those skilled in the art having the benefit of the teachings herein. Although individual examples are discussed, the disclosure covers all combinations of all of the examples. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative examples disclosed above may be altered or modified and all such variations are considered within the scope and spirit of those examples. If there is any conflict in the usages of a word or term in this specification and one or more patent(s) or other documents that may be incorporated herein by reference, the definitions that are consistent with this specification should be adopted.

What is claimed is:

1. A method for estimating a mud angle, comprising:
disposing a downhole tool into a borehole;
extending an arm of the downhole tool to a first location, wherein a pad is disposed on the arm;
taking a first impedance measurement with at least one button electrode, wherein the button electrode is disposed in a button array, wherein the button array is disposed on the pad;
extending the arm to a second location;
taking a second impedance measurement with the at least one button electrode; and
estimating the mud angle from the first impedance measurement and the second impedance measurement with an information handling system.

2. The method of claim 1, further comprising utilizing the first impedance measurement and the second impedance measurement in an inversion process to determine a curve that approximates angle of impedance as a function of distance from a borehole wall.

3. The method of claim 2, further comprising using the curve to determine the mud angle, constructing an image representative of a resistivity of a formation around the borehole based, at least in part, on the mud angle, and utilizing an estimated mud angle to improve display of the image.

4. The method of claim 1, wherein the estimating the mud angle comprises using an interpolation process.

5. The method of claim 1, wherein the estimating the mud angle comprises taking a difference between the first impedance measurement and the second impedance measurement, wherein the difference is mainly proportional to mud impedance.

6. The method of claim 5, wherein the difference is used to graph a curve of angle of impedance versus distance from a borehole wall.

7. The method of claim 6, further comprising fitting the curve to determine the mud angle, constructing an image representative of a resistivity of a formation around the borehole based, at least in part, on the mud angle, and utilizing an estimated mud angle to improve display of the image.

8. The method of claim 1, further comprising:
extending the arm to a third location;
taking a third impedance measurement of the at least one button electrode; and
transmitting the third impedance measurement to the information handling system.

9. The method of claim 8, further comprising:
extending the arm to a fourth location;
taking a fourth impedance measurement of the at least one button electrode; and
transmitting the fourth impedance measurement to the information handling system.

10. The method of claim 9, using the first impedance measurement, the second impedance measurement, the third impedance measurement, and the fourth impedance measurement to estimate the mud angle.

11. A system for determining a formation boundary, comprising:
a downhole tool, wherein the downhole tool comprises:
an arm; and
a pad, wherein the pad comprises a button array and at least one return electrode;
a conveyance; and
an information handling system, wherein the information handling system is configured to:
extend the arm of the downhole tool to a first location, wherein the pad is disposed on the arm;
take a first impedance measurement with at least one button electrode, wherein the at least one button electrode is disposed in the button array, wherein the button array is disposed on the pad;
extend the arm to a second location;
take a second impedance measurement with the at least one button electrode; and
estimate a mud angle from a first impedance measurement and a second impedance measurement.

12. The system of claim 11, wherein the conveyance is a wireline, wherein the downhole tool is disposed on a wireline.

13. The system of claim 11, wherein the conveyance is a drill string, wherein a bottom hole assembly is disposed on the drill string, wherein the downhole tool is disposed in the bottom hole assembly.

14. The system of claim 11, wherein the information handling system is further configured to utilize the first impedance measurement and the second impedance measurement in an inversion to determine a curve that approximates angle of impedance as a function of distance from a borehole wall.

15. The system of claim 14, wherein the information handling system is further configured to use the curve to determine the mud angle, construct an image representative of a resistivity of a formation around a borehole based, at least in part, on the mud angle, and to utilize an estimated mud angle to improve display of the image.

16. The system of claim 11, wherein the information handling system is further configured to estimate the mud angle using an interpolation process.

17. The system of claim 11, wherein the information handling system is further configured to estimate the mud angle by taking a difference between the first impedance measurement and the second impedance measurement, wherein the difference is mainly proportional to mud impedance.

18. The system of claim 17, wherein the difference is used to graph a curve of angle of impedance versus distance from a borehole wall.

19. The system of claim 18, wherein the information handling system is further configured to fit the curve to determine the mud angle, construct an image representative of a resistivity of a formation around the borehole based, at least in part, on the mud angle, and to utilize an estimated mud angle to improve display of the image.

20. The system of claim 11, wherein the information handling system is further configured to use the first impedance measurement, the second impedance measurement, a third impedance measurement, and a fourth impedance measurement to estimate the mud angle.

* * * * *